United States Patent
Wachter et al.

(10) Patent No.: US 11,095,193 B2
(45) Date of Patent: Aug. 17, 2021

(54) ELECTRONIC POWER MODULE FOR A POWER TOOL HAVING AN INTEGRATED HEAT SINK

(71) Applicant: Black & Decker Inc., New Britain, CT (US)

(72) Inventors: Eric W. Wachter, Baltimore, MD (US); Erik A. Ekstrom, York, PA (US); Alpay Hizal, Columbia, MD (US)

(73) Assignee: Black & Decker Inc., New Britain, CT (US)

( * ) Notice: Subject to any disclaimer, the term of this patent is extended or adjusted under 35 U.S.C. 154(b) by 75 days.

(21) Appl. No.: 16/705,460

(22) Filed: Dec. 6, 2019

(65) Prior Publication Data
US 2020/0112233 A1 Apr. 9, 2020

Related U.S. Application Data

(63) Continuation of application No. 15/603,958, filed on May 24, 2017, now Pat. No. 10,608,501, and a continuation of application No. 15/603,837, filed on May 24, 2017, now Pat. No. 10,541,588.

(51) Int. Cl.
| | |
|---|---|
| *H02K 9/00* | (2006.01) |
| *H02K 9/22* | (2006.01) |
| *B25F 5/00* | (2006.01) |
| *H02K 11/33* | (2016.01) |
| *H02K 7/14* | (2006.01) |
| *H02K 11/28* | (2016.01) |
| *B25B 21/02* | (2006.01) |
| *H02K 5/22* | (2006.01) |
| *H05K 1/02* | (2006.01) |
| *H05K 1/11* | (2006.01) |
| *H05K 1/18* | (2006.01) |

(52) U.S. Cl.
CPC ............... *H02K 9/22* (2013.01); *B25B 21/02* (2013.01); *B25F 5/00* (2013.01); *B25F 5/008* (2013.01); *H02K 5/225* (2013.01); *H02K 7/145* (2013.01); *H02K 11/28* (2016.01); *H02K 11/33* (2016.01); *H05K 1/0204* (2013.01); *H05K 1/111* (2013.01); *H05K 1/181* (2013.01); *H05K 2201/066* (2013.01); *H05K 2201/10053* (2013.01)

(58) Field of Classification Search
CPC ...... H02K 7/145; H02K 11/33; H05K 1/0204; H05K 2201/066; B25F 5/00; B25F 5/008
See application file for complete search history.

(56) References Cited

FOREIGN PATENT DOCUMENTS

EP 3035516 A2 * 6/2016 ........... H02K 11/215

\* cited by examiner

*Primary Examiner* — Ramon M Barrera
(74) *Attorney, Agent, or Firm* — Amir R. Rohani

(57) ABSTRACT

An electronic switch module for a power tool having an electric motor is provided, including a printed circuit board (PCB), power switches mounted on the PCB and configured to switchably supply electric power from a power source to the electric motor, a series of primary heat sinks mounted on the PCB in association with the power switches, and a secondary heat sink mounted on the primary heat sinks. Output wires attached to the PCB to facilitate electrical connection between the power switches and the electric motor are passed through a slot of the secondary heat sink.

20 Claims, 15 Drawing Sheets

ELECTRONIC POWER MODULE FOR A POWER TOOL HAVING AN INTEGRATED HEAT SINK

RELATED APPLICATION

This application is a continuation of U.S. patent application Ser. No. 15/603,837 filed May 24, 2017, and a continuation of U.S. patent application Ser. No. 15/603,958 filed May 24, 2017, both of which are incorporated herein by reference in their entireties.

FIELD

This application relates to an electronic power module, and in particular to an electronic power module in a power tool for driving a brushless DC motor.

BACKGROUND

Use of cordless power tools has increased dramatically in recent years. Cordless power tools provide the ease of a power assisted tool with the convenience of cordless operation. Conventionally, cordless tools have been driven by Permanent Magnet (PM) brushed motors that receive DC power from a battery assembly or converted AC power. In a PM brushed motor, commutation is achieved mechanically via a commutator and a brush system. By contrast, in a brushless DC motor, commutation is achieved electronically by controlling the flow of current to the stator windings. A brushless DC motor includes a rotor for providing rotational energy and a stator for supplying a magnetic field that drives the rotor. Comprising the rotor is a shaft supported by a bearing set on each end and encircled by a permanent magnet (PM) that generates a magnetic field. The stator core mounts around the rotor maintaining an air-gap at all points except for the bearing set interface. Included in the air-gap are sets of stator windings that are typically connected in either a three-phase wye or Delta configuration. Each of the windings is oriented such that it lies parallel to the rotor shaft. Power devices such as MOSFETs are connected in series with each winding to enable power to be selectively applied. When power is applied to a winding, the resulting current in the winding generates a magnetic field that couples to the rotor. The magnetic field associated with the PM in the rotor assembly attempts to align itself with the stator generated magnetic field resulting in rotational movement of the rotor. A control circuit sequentially activates the individual stator coils so that the PM attached to the rotor continuously chases the advancing magnetic field generated by the stator windings. A set of sense magnets coupled to the PMs in the rotor assembly are sensed by a sensor, such as a Hall Effect sensor, to identify the current position of the rotor assembly. Proper timing of the commutation sequence is maintained by monitoring sensors mounted on the rotor shaft or detecting magnetic field peaks or nulls associated with the PM.

Conventionally, power switches are provided within the power tool in close proximity to the motor or within the handle. Electronics including a controller for controlling the power devices are also provided within the handle or in the vicinity of the motor. A trigger switch assembly is also provided, preferable on the handle where it is easy for the user to engage. The controller is coupled to both the trigger assembly and the power devices and regulates the flow of power through the power devices based on, for example, the travel distance of the trigger assembly.

The size and type of power devices may vary depending on the power requirements of the power tool. For low-voltage applications (e.g., 20V DC max), relatively small FETs that generate low heat may be suitable. However, as the tool voltage rating and/or power requirement increase, larger FETs or IGBTs, which generate considerably more heat, may be needed. What is needed is an integrated power, control, and switch module that meets the heat dissipation requirements of these power devices.

This section provides background information related to the present disclosure and is not necessarily prior art.

SUMMARY

This section provides a general summary of the disclosure, and is not a comprehensive disclosure of its full scope or all of its features.

According to an aspect of the invention, an electronic switch module for a power tool having an electric motor is provided, including a printed circuit board (PCB), power switches mounted on the PCB and configured to switchably supply electric power from a power source to the electric motor, a series of primary heat sinks mounted on the PCB in association with the power switches, and a secondary heat sink mounted on the primary heat sinks and securely fastened to at least one of the primary heat sinks via a fastener, the secondary heat sink being electrically insulated from at least one of the primary heat sinks.

In an embodiment, a module housing is provided within which the PCB is disposed.

In an embodiment, a thermal pad is disposed between an upper portion of the primary heat sinks and a lower portion of the secondary heat sink to electrically insulate the secondary heat sink from the primary heat sinks. In an embodiment, the thermal pad is made of thermally conductive material.

In an embodiment, an insulating frame is mounted over the secondary heat sink. In an embodiment, the insulating frame includes an insulating rim portion disposed to electrically insulate the fastener from the secondary heat sink.

In an embodiment, motor wires are provided and end of the motor wires are attached to the PCB to facilitate electrical connection with the power switches. In an embodiment, the secondary heat sink includes a slot arranged to receive the motor wires therethrough.

In an embodiment, the secondary heat sink includes a main body and at least one leg projecting downwardly from the main body, and the electronic switch module includes at least one thermal pad strip made of deformable thermally-conductive and electrically-insulating material disposed between the leg of the secondary heat sink and the PCB.

In an embodiment, at least one metal body is disposed over the PCB for heat transfer from at least one of a circuit component mounted on the PCB or conductive track on the PCB. In an embodiment, the thermal pad strip is disposed between the metal body and the leg of the secondary heat sink.

In an embodiment, a controller is disposed on the PCB, and an input unit coupled to a trigger switch is also provided. In an embodiment, the controller is configured to control a switching operation of the power switches based on an input from the input unit.

In an embodiment, a power tool is provided including a housing, a motor disposed in the housing, and an electronic switch module coupled to the motor to control a supply of power to the motor. In an embodiment, the electronic switch module may be provided with features described in the preceding paragraphs.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

Example embodiments of the present invention will become more fully understood from the detailed description given herein below and the accompanying drawings, wherein like elements are represented by like reference numerals, which are given by way of illustration only and thus are not limitative of the example embodiments of the present invention.

DESCRIPTION

Example embodiments will now be described more fully with reference to the accompanying drawings.

Figure 1:
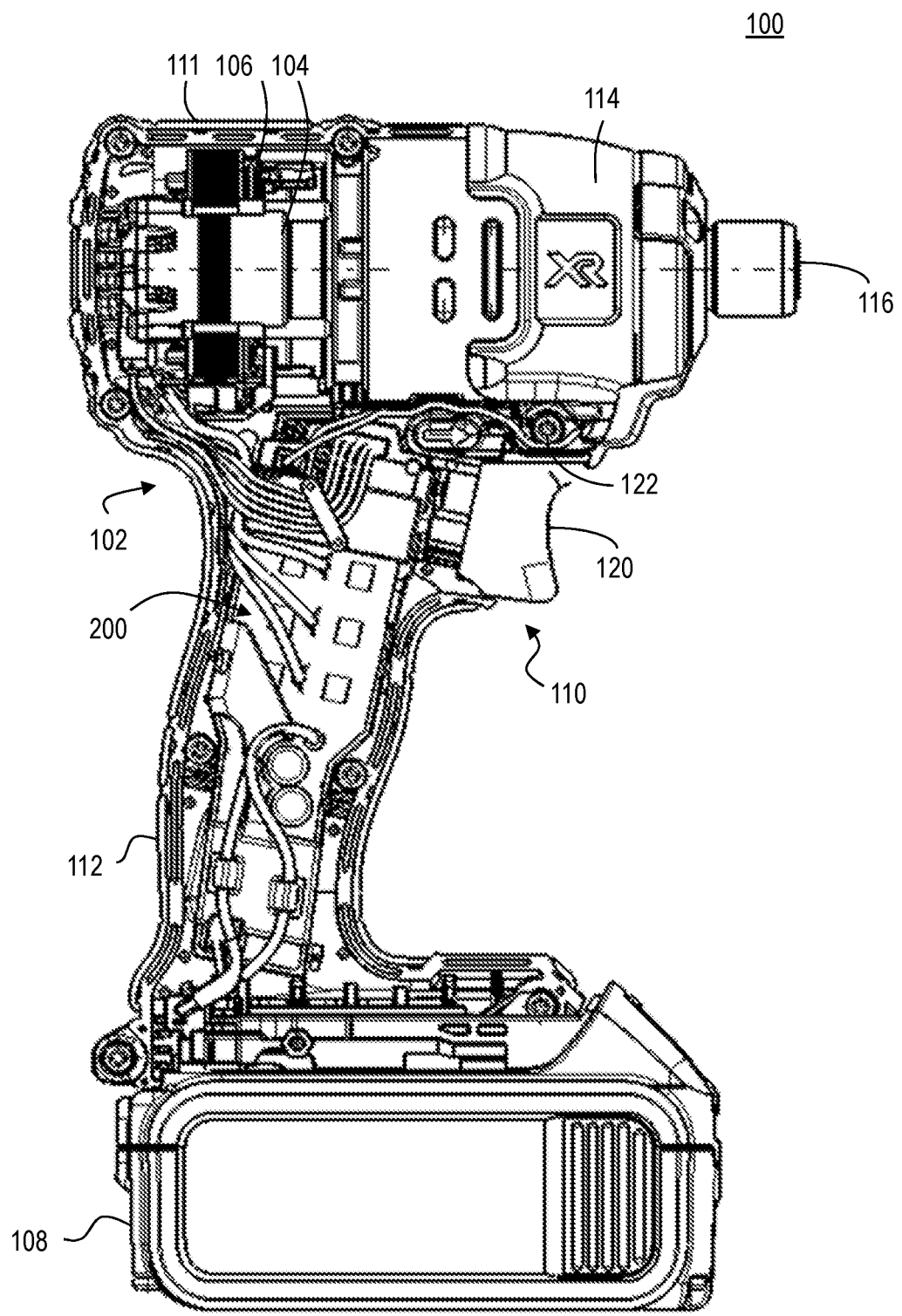
FIG. 1 depicts a longitudinal cross-sectional view of a power tool with a housing half removed, according to an embodiment.

With reference to the FIG. 1, a power tool 100 constructed in accordance with the teachings of the present disclosure is illustrated in a longitudinal cross-section view. Power tool 100 in the particular example provided may be a hand held impact driver, but it will be appreciated that the teachings of this disclosure is merely exemplary and the power tool of this invention could be any power tool. The power tool shown in FIG. 1 may include a housing 102, an electric motor 104, a battery pack 108, a transmission assembly (gear case) 114, and an output spindle 116. The gear case 114 may be removably coupled to the housing 102. The housing 102 can define a motor housing 111 and a handle 112.

According to an embodiment, motor 104 is received in motor housing 111. Motor 104 maybe be any type of motor and may be powered by an appropriate power source (electricity, pneumatic power, hydraulic power). In an embodiment, the motor is a brushless DC electric motor and is powered by a battery pack 108.

According to an embodiment of the invention, power tool 100 further includes an integrated electronic switch and control module 200 (hereinafter referred to as "electronic control module", or "control module"). Electronic control module 200, in an embodiment, may include a controller and electronic switching components for regulating the supply of power from the battery pack 108 to motor 105. In an embodiment, electronic control module 200 is disposed within the handle 112 below the motor housing 111, though it must be understood that depend on the power tool shape and specifications, electronic control module 200 may be disposed at any location within the power tool. Electronic control module may also integrally include components to support a user-actuated input unit 110 (hereinafter referred to as "input unit" 110) for receiving user functions, such as an on/off signal, variable-speed signal, and forward-reverse signal. In an embodiment, input unit 100 may include a variable-speed trigger 120, although other input mechanism such as a touch-sensor, a capacitive-sensor, a speed dial, etc. may also be utilized. In an embodiment, an on/off signal is generated upon initial actuation of the variable-speed trigger 120. In an embodiment, a forward/reverse button 122 is additionally provided on the tool 100. The forward/reverse button 122 may be pressed on either side of the tool in a forward, locked, or reverse position. In an embodiment, the associated circuitry and components of the input unit 110 that support the variable-speed trigger 120 and the forward/reverse button 122 may be fully or at least partially integrated into the electronic control module 200. Based on the input signals from the input unit 110 and associated components, the controller and electronic switching components of the electronic control module 200 modulate and regulate the supply of power from the battery pack 108 to motor 105. Details of the electronic control module 200 are discussed later in detail.

While in this embodiment, the power source is battery pack 108, it is envisioned that the teachings of this disclosures may be applied to a power tool with an AC power source. Such a power tool may include, for example, a rectifier circuit coupled to the AC power source.

It must be understood that, while FIG. 1 illustrates a power tool impact driver having a brushless motor, the teachings of this disclosure may be used in any power tool, including, but not limited to, drills, saws, nailers, fasteners, impact wrenches, grinders, sanders, cutters, etc. Also, teachings of this disclosure may be used in any other type of tool or product that include a rotary electric motor, including, but not limited to, mowers, string trimmers, vacuums, blowers, sweepers, edgers, etc.

Figure 2A:
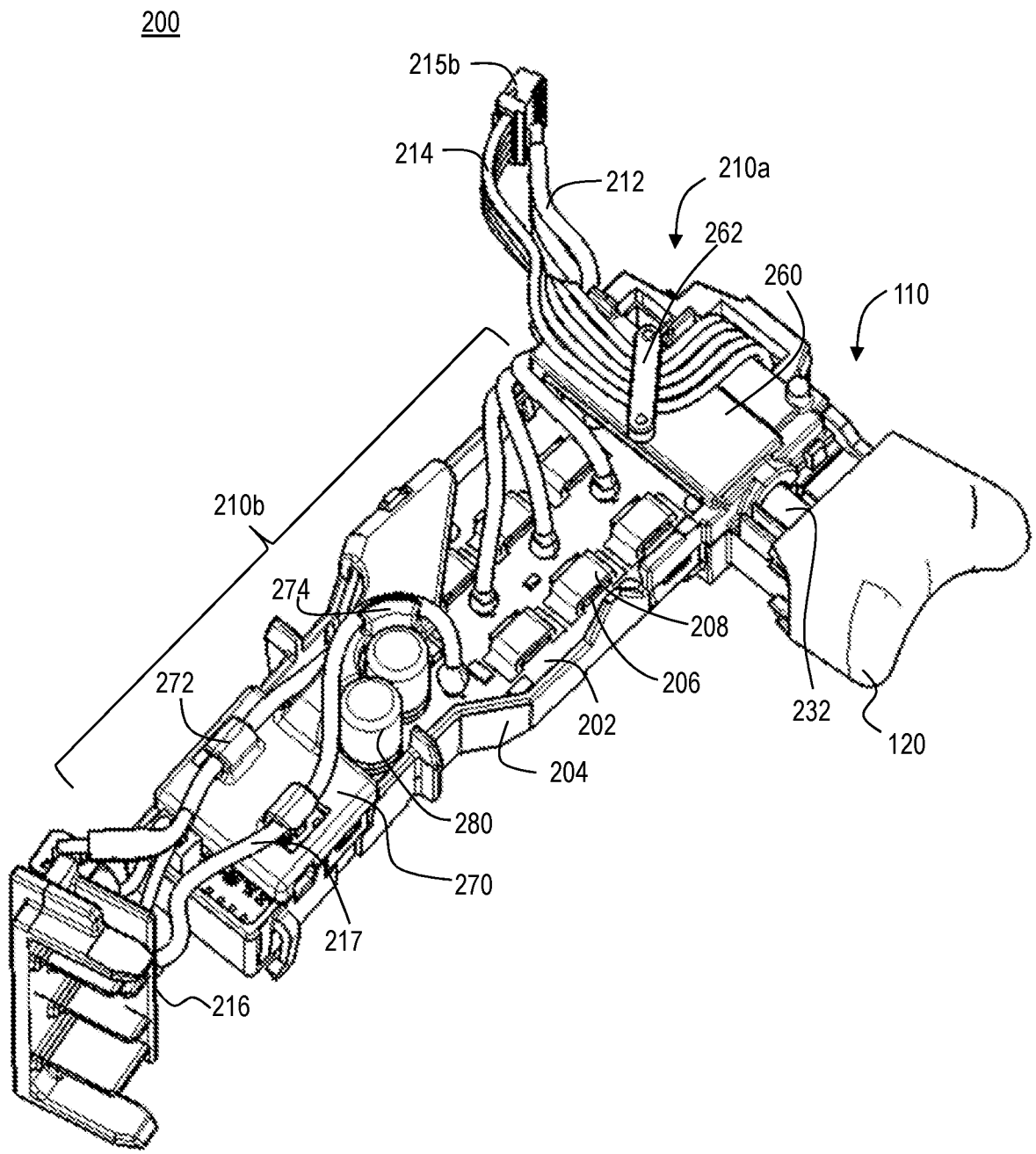
FIGS. 2A and 2B depict perspective views of an electronic control module from two different angles, according to an embodiment.
Figure 2B:
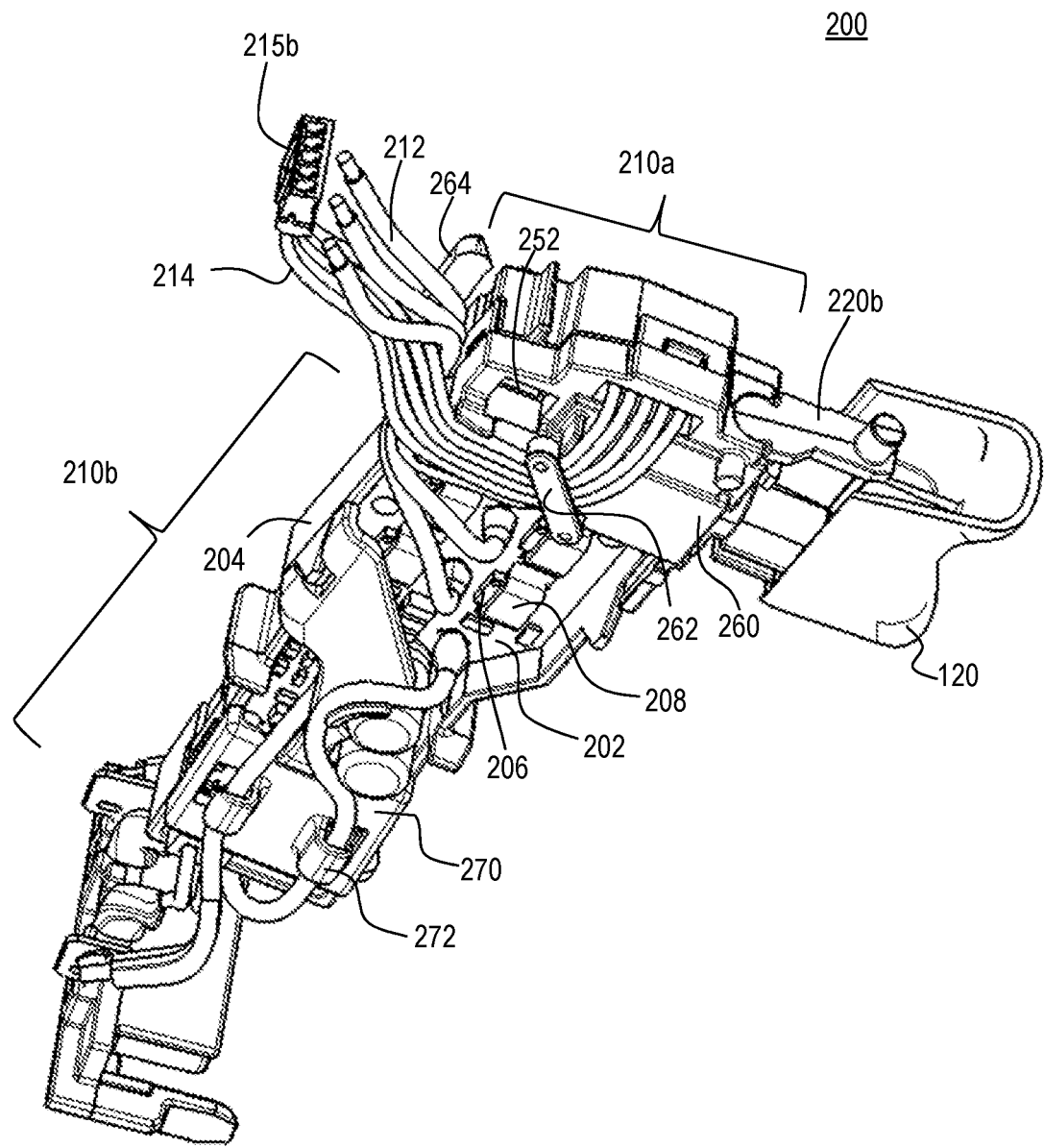
Figure 3A:
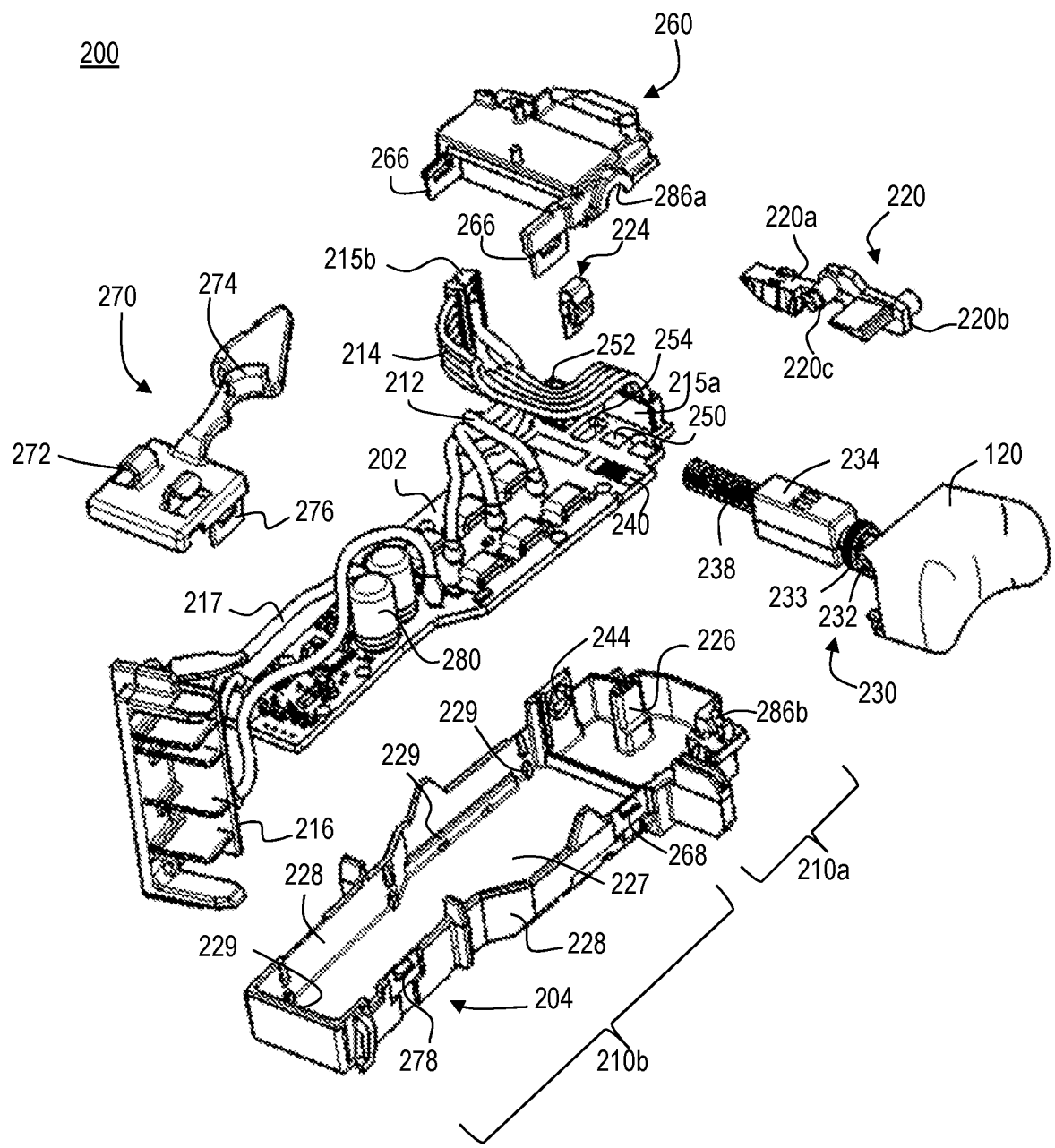
FIGS. 3A and 3B respectively depict expanded front and back perspective views of the electronic control module, according to an embodiment.
Figure 3B:
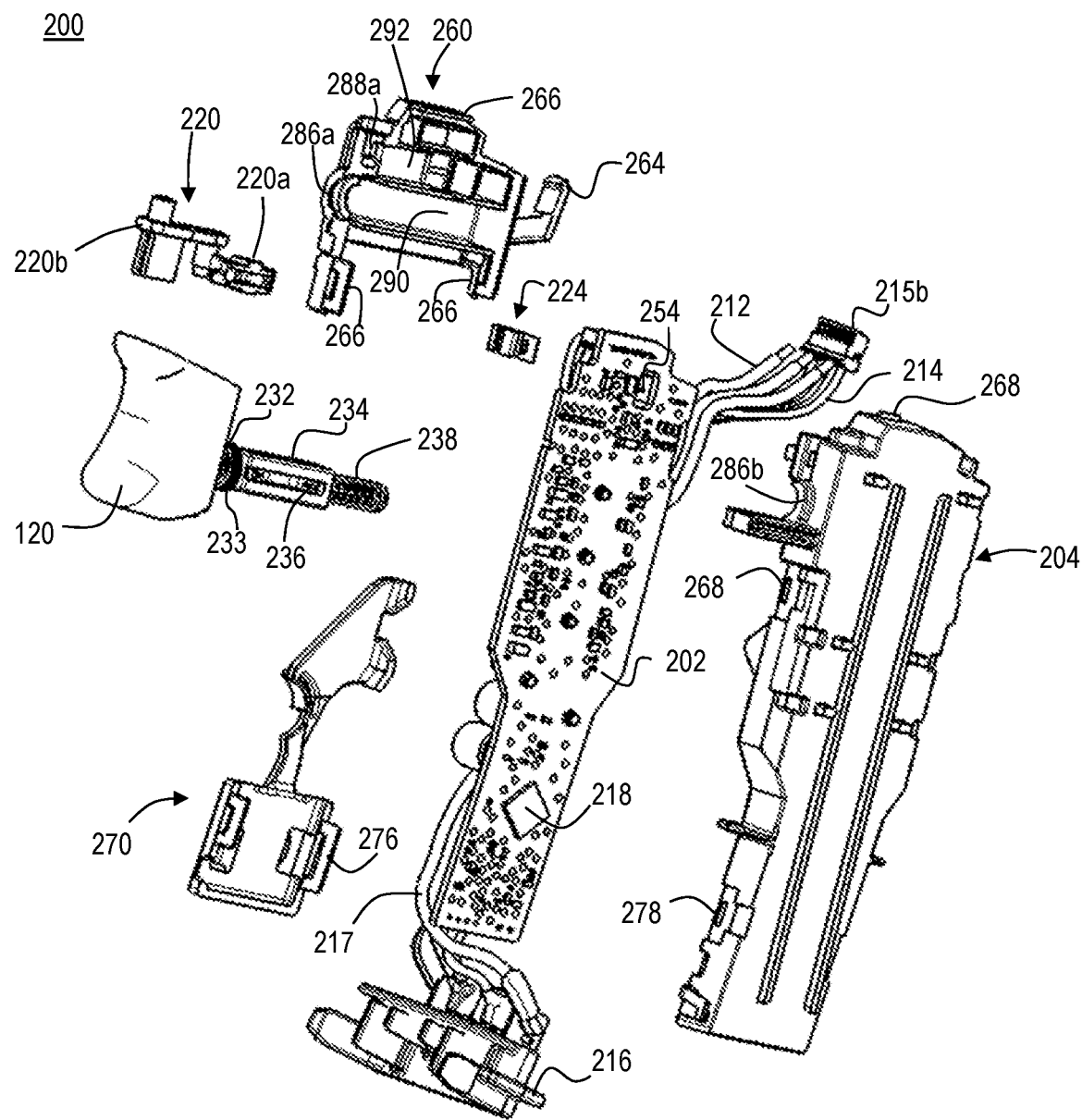

The electronic control module 200 is described herein, according to an embodiment of the invention. FIGS. 2A and 2B depict perspective views of electronic control module 200 from two different angles, according to an embodiment. FIGS. 3A and 3B depict exploded front and back views of the same module 200, according to an embodiment. Reference is made to these drawings herein.

Electronic control module 200, in an embodiment, includes a printed circuit board (PCB) 202 arranged and mounted inside a module housing 204. Module housing 204 includes a bottom surface 227, side walls 228, and an open face. PCB 202 is inserted through the open face and secured inside the module housing 204. Side walls 228 include retention features 229 for securely holding the PCB 202 at a distance from the bottom surface 227. Control module 200 includes two compartments—an enclosed compartment 210a that houses and encloses a first part of the PCB 202 and components associated with the input unit 110, as described below, and an open compartment 210b, and partially encloses a second part of the PCB 202. Within the open compartment 210b, module housing 204 encloses the lower surface and the sides of PCB 202, but leaves the upper surface of the PCB 202 substantially exposed. Mounted on the upper surface of PCB 202 are a series of power switches 206 and a series of heat sinks disposed over the power switches 206 and secured to the PCB 202. As discussed below in detail, this arrangement allows cooling air to transfer heat away from the heat sinks 208 within the power tool 100, but protects the input unit 110 components from any dust and debris from the cooling air.

According to an embodiment, control module 200 includes a controller 218. In an embodiment, the controller may be mounted to a lower surface of the PCB 202 and be in electronic communication with the rest of the PCB 202 components through vias (not shown). In an embodiment, controller 218 may be a programmable micro-controller, micro-processor, or other processing unit capable of controlling the motor and various aspects of power tool. For example, controller 218 may be programmed to turn on and off power switches 206, as discussed below, to control commutation of the brushless motor. In an embodiment, controller 218 may be coupled to a series of gate drivers disposed on the PCB 202, which in turn are connected to the gates of the power switches 206. Alternatively, controller 218 may be a circuit chip that includes both a micro-controller and the gate drivers and be coupled directly to the gates of the power switches 206. Using the gate drivers, controller 218 turns the power switches 206 on or off selectively to commutate the motor and control the speed of the motor. Additionally, the controller may be programmed to various tool and battery pack operation features, such as tool and/or temperature control, battery pack voltage control, and tool over-current detection and control, etc. In an alternative embodiment, the controller may be an Application Specific Integrated Circuit (ASIC) configured to control the aforementioned aspects of the motor, battery, and power tool.

In an exemplary embodiment, power switches 206 may be Field Effect Transistors (FETs). In an embodiment, six power switches 206, including three high-side power switches and three low-side power switches, are arranged and coupled together as a three-phase bridge rectifier circuit. Using the gate drivers, controller 218 sequentially turns the power switches 206 on and off within each phase of the brush motor 104 commutation. Further, the controller 218 performs pulse-width modulation (PWM) of the power switches 206 within each phase to regulate the speed of the motor based on speed signals received from input unit 110, as described below. Controller 218 further controls the direction of motor commutation based on a forward/reverse signal received from input unit 110, also discussed below.

It is noted that while the power switches 206 discussed herein are FETs, other types of power switches such as BJTs or IGBTs may be utilized. Additionally, while power switches 206 are arranged as a three-phase bridge rectifier for driving a three-phase brushless motor, other number and arrangement of power switches may be used to drive other types of motors, including brushed or brushless motors.

As described above, module housing 204 leaves the upper surface of the PCB 202 exposed, thus allowing heat to dissipate from the heat sinks 208. Electronic control module 200 may be placed within a path of air flow inside the power tool, e.g., inside the power tool handle 112 in fluid communication with motor fan 106 so that airflow generated by motor fan 106 runs through the handle 112. The air flow generated within the handle further improves heat dissipation from the electronic control module 200.

In an embodiment, the PCB 202 is further potted with a layer of potting compound (not shown) in the open compartment 210b. The layer of potting compound, in an embodiment, substantially covers most of the circuit components on the PCB, but leave a top plate of heat sinks 206 exposed so the heat sinks 208 can dissipate heat away from the power switches 206. While the potting compound is not shown in FIGS. 2A-3B, the control module of FIG. 1 is shows with the potting compound disposed inside the housing 202.

Figure 4A:
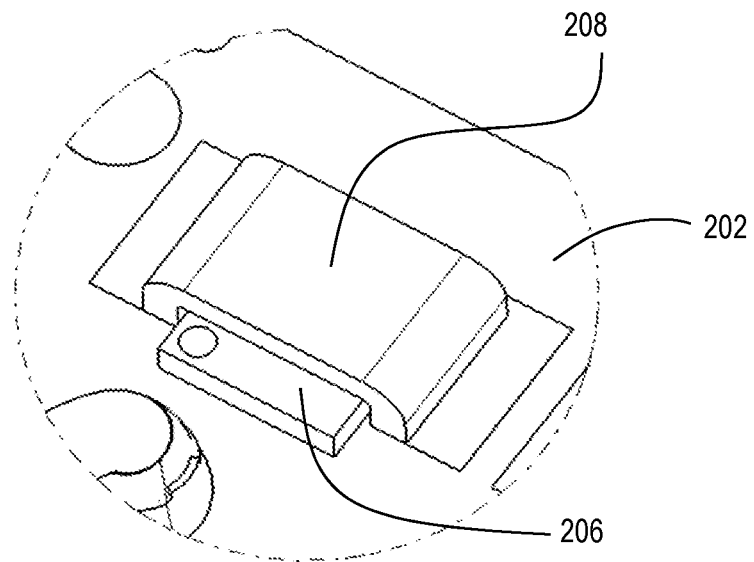
FIGS. 4A and 4B respectively depict a zoomed-in perspective view and a cross-sectional view of a the electronic control module showing the arrangement of a power switch and a heat sink on a printed circuit board (PCB), according to an embodiment.
Figure 4B:
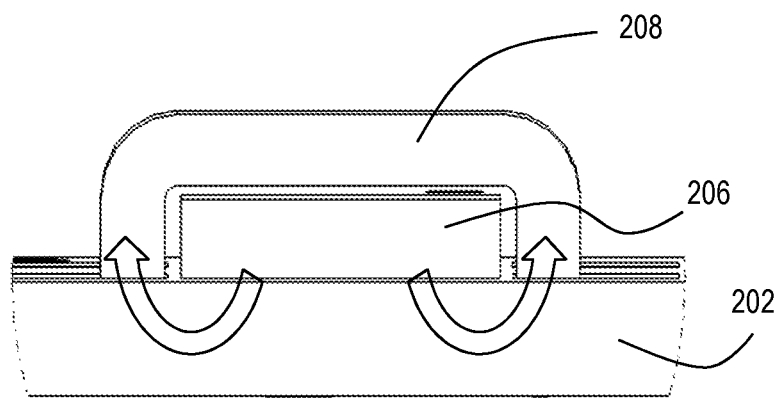

FIGS. 4A and 4B depict zoomed-in perspective and cross-sectional views of PCB 202, showing the arrangement of heat sink 208 and power switch 206 (in this case a FET) mounted over PCB 202, according to an embodiment. Heat sink 208 includes two legs mounted on the PCB 202. The main plate of heat sink 208 is located directly above power switch 206 at close proximity thereto. This allows heat to be transferred directly from power switch 206 to the heat sink 208 through a small air gap between the two. In an embodiment, the main plate of the heat sink 208 has a surface area of 10 to 40 mm$^2$, preferably 15-35 mm$^2$, more preferably 20-30 mm$^2$, that is exposed after the potting compound is applied. In addition, one or more of the legs of the heat sink 208 is electrically connected to the drain of power switch 206 on the PCB 202. This arrangement further improves heat transfer from the FET 206 to the heat sink 208.

It is noted that while in this embodiment discrete heat sinks 208 are mounted on respective power switches 206, a lower number of heat sinks 208 may be utilized instead. In an alternative embodiment of the invention, a single heat sink is mounted on the PCB over the power switches 206 to provide a higher surface area for heat transfer.

Referring back to FIGS. 2A through 3B, in an embodiment, a series of output wires 212 are secured on one end to a surface of the PCB 202. These wires connect the outputs of the power switches three-phase bridge rectifier to the power terminals the brushless motor 104. In an embodiment, a series of control signal wires 214 are also secured to a wire receptacle 215a. In an embodiment, wire receptacle 215a is mounted on the PCB and is in electrical communication with the controller 218. The control signal wires 214 allow the controller 218 to communicate with other parts of the power tool 100, such as the motor 104 and the battery 108. In an embodiment, hall signals from the brushless motor hall sensors communicate with the controller 218 through these control signal wires 214. Control signal wires 214 may additionally be provided with a control terminal 215b to ease plug-in connectivity of external wires with the control signal wires 214. In an embodiment, a pair of power input wires 217 are also secured on the surface of PCB 202. These wires are coupled to a power source (e.g., battery 108) via a power terminal 216 to supply power from the power source to the power switches 206.

In an embodiment, control module 200 includes an encapsulation member 260 that mates with the module housing 204 to form the enclosed compartment 210a of control module 200. As discussed below in detail, encapsulation member 260 protects components associated with input unit 110 from dust and debris. Encapsulation member 260 also includes wire retaining features 262 and wire guide features 264 for retaining and positioning signal wires 214 and/or power output wires 212 away from the housing 204. Encapsulation member 260 further includes mating features 266 that mate with corresponding mating features 268 on the module housing 204. In an embodiment, the mating features 268 include lips that snap fit into slots in mating features 266. In an embodiment, encapsulation member 260 further includes an opening 269 that allows control signal wires 214 to connect to PCB-side control terminal 215a.

Additionally, in an embodiment, control module 200 includes an additional cover 270 that covers a lower portion of PCB 202. Cover 270 also includes wire retaining features 272 for retaining the power wires 217, as well as wire guide features 274 for guiding the wires 217 around circuit components (e.g., capacitors 280) mounted on PCB 202. Cover 270 further includes mating features 276 that mate with corresponding mating features 278 on the module housing 204. In an embodiment, the mating features 278 include lips that snap-fit into slots in mating features 276.

In an embodiment, control module 200 is additionally provided with an auxiliary control terminal 252 mounted on a top portion of the PCB 202 that allows the controller 218 with other motor or tool components. In an embodiment, auxiliary control terminal 252 allows the controller 218 to communicate with an LED provided on the tool 100. In an embodiment, auxiliary control terminal 252 is provided outside and adjacent to the enclosed compartment 210a.

The input unit 110 is discussed herein, according to an embodiment of the invention. According to an embodiment, input unit 110 is at least partially integrated into control module 200. In an embodiment, input unit 110 incorporates electro-mechanical elements for variable-speed detection, on/off detection, and forward/reverse detection inside the enclosed compartment 210a of control module 200, as discussed herein.

In an embodiment, input unit 110 includes a forward/reverse actuator 220 supported by the enclosed compartment 210a portion of the module housing 204. In an embodiment, forward/reverse actuator 220 includes a contact member 220a, which holds an electrical connector 222 and is disposed inside the enclosed compartment 210a of the module housing 204, and an engagement member 220b, which is located outside the module housing 204. In an embodiment, engagement member 220b is in moving contact with forward/reverse button 122 on the power tool 100. A pivot member 220c located between the contact member 220a and engagement member 220b is supported by the module housing 204 and provides a pivot point for the forward/reverse actuator. A biasing member 224 is secured to the module housing 204 to engage and bias the contact member 220a in a forward, neutral (e.g., locked), or reverse direction. In an embodiment, biasing member 224 is secured in an opening of a holder, i.e. a post 226 that projects from the bottom surface 227 of the module housing 204 within the enclosed compartment 210a. In an embodiment, PCB 202 is provided with a through-hole 254 that receives the post 226. When the user presses the forward/reverse button 122 from either side of the tool to a forward, locked, or reverse position, the forward/reverse button 122 moves the engagement member 220 around the pivot portion 220c. Pivoting movement of the engagement member 220b around the pivot portion 220c causes the electrical connector 222 of contact member 220a to make or break contact with a contact-sensing member against the biasing force of the biasing member 224. In an embodiment, contact sense member includes a pair of conductive tracks 250 arranged on PCB 202.

In an embodiment, one of the conductive tracks 250 is electrically connected to power source 108 and the other is connected to and sensed by controller 218. Voltage is present and sensed by the controller 218 when electrical connector 222 makes contact with the pair of conductive tracks 250, thus electrically connecting the two conductive tracks 250. Presence or lack of sensed voltage is indicative of whether the motor should rotate in the forward or reverse direction. Functional details of use and electrical connectivity of conductive tracks 250 for forward/reserve detection are discuss in U.S. Pat. No. 9,508,498 filed May 21, 2012, which is incorporated herein by reference in its entirety.

According to an embodiment, input unit 110 further includes a variable-speed actuator 230. Variable-speed actuator includes a link member 232 that extends out of the module housing 204 from a sliding member 234 that is arranged inside the module housing 204 and supports a conductive wiper 236. Link member 232 is coupled to trigger 120 that is engageable by the user. The sliding member 234 supports and engages a compression spring 238 its longitudinal end opposite link member 232. Compression spring 238 is located between an inner wall of the module housing 204 and the sliding member 234. When the user presses the trigger 120, the sliding member 234 moves against a biasing force of the spring 238.

Conductive wiper 236 contacts a speed-sensing member located on the surface of the PCB 202. In an embodiment, the speed-sensing member is a series of variable-speed conductive tracks 240 arranged on the PCB 202. Actuation of the trigger 120 moves the conductive wiper 236 over the conductive tracks 240. Initial movement of the conductive wiper 236 over the conductive tracks 240 generates a signal that turns controller 218 ON. Additionally, an analog variable-voltage signal is generated based on the movement of the conductive wiper 128 over the conductive tracks and that signal is sent to the micro-controller. This signal is indicative of the desired motor speed. Functional details of ON/OFF and variable-speed detection using conductive tracks 240 are discuss in U.S. Pat. No. 9,508,498 filed May 21, 2012, which is incorporated herein by reference in its entirety. It must be understood, however, that any known variable-voltage speed-sensing mechanism, such as a resistive tape, may be a utilized within the scope of the invention.

It is noted that the moving mechanical parts of the forward/reverse actuator 220 and variable-speed actuator 230 (including the electrical connector 222 and conductive wiper 236), alone or in combination with conductive tracks 240 and 250, are referred to in this disclosure as "electro-mechanical" elements.

Figure 5:
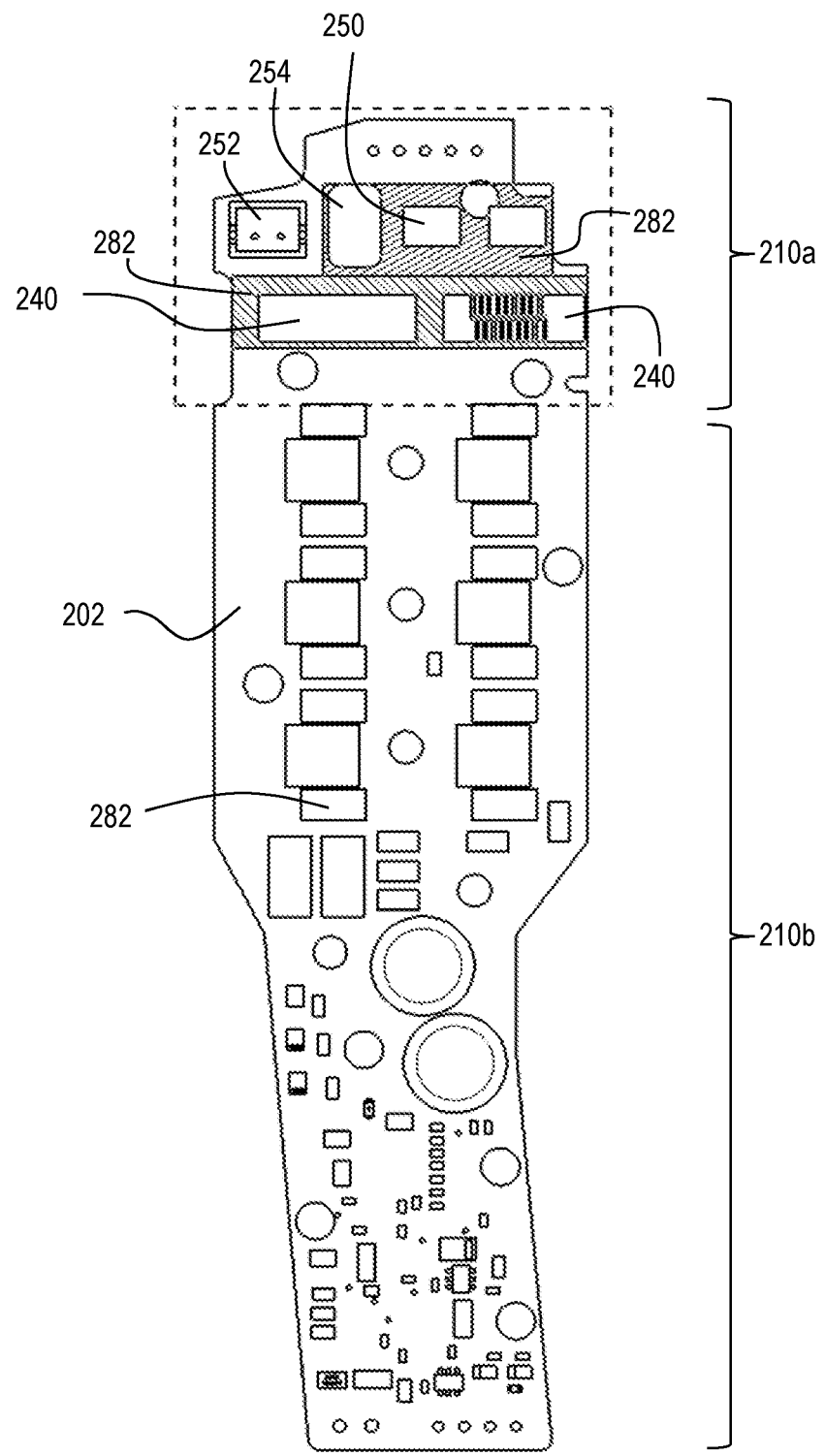
FIG. 5 depicts a top view of the PCB, according to an embodiment.

FIG. 5 depicts a top view of PCB 202 alone without any components mounted. As shown herein, PCB 202 is provided with metal traces 282 for mounting the power switches 206, as well as variable-speed conductive tracks 240 and forward/reverse conductive 250. Through-hole 254 and auxiliary terminal 252 is also shown in this figure.

In an embodiment, a layer of silicon conformal coating is applied to the PCB 202 to protect it from dust, debris, moisture, and extreme temperature changes. However, since the conductive tracks 250 and 240 need to remain exposed to make electrical contact with the forward/reverse electrical connector 222 and variable-speed conductive wiper 236, a high temperature resistant tape 284 is applied to the PCB 202 over the conductive tracks 240 and 250 before the silicon conformal coating is applied. The high temperature resistant tape 284 ensures that the silicon conformal coating does not cover the conductive tracks 240 and 250.

Figure 6:
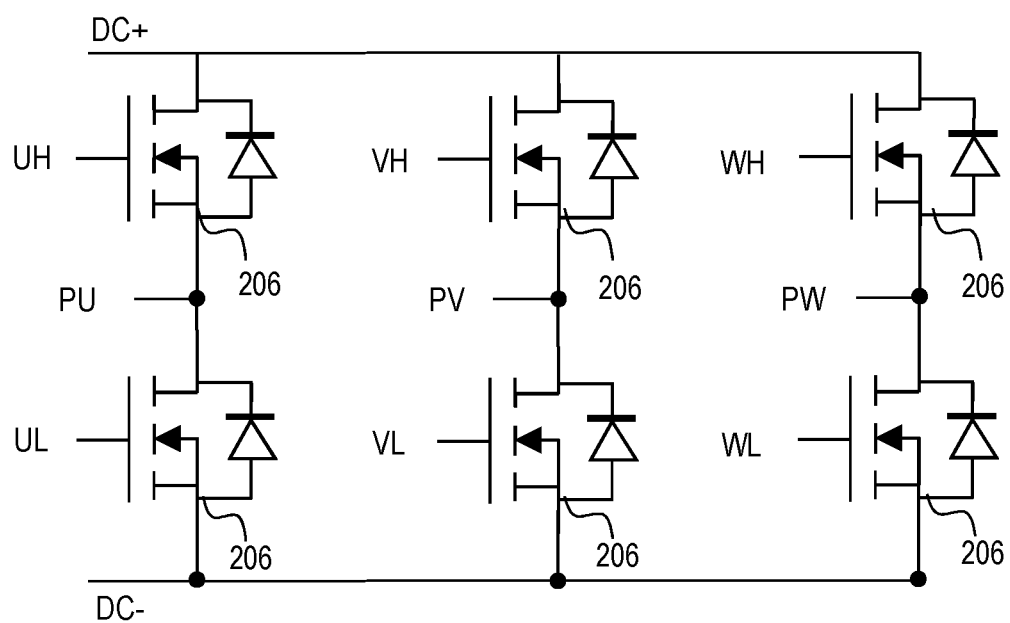
FIG. 6 depicts an exemplary circuit diagram of power switches configured as a three-phase inverter, according to an embodiment.

FIG. 6 depicts an exemplary circuit diagram of the power switches 206 configured as a three-phase inverter bridge circuit, according to an embodiment. As shown herein, the three-phase inverter bridge circuit includes three high-side and three low-side switches 206. The gates of the high-side power switches are driven via drive signals UH, VH, and WH, and the gates of the low-side power switches are driven via drive signals UL, VL, and WL. In an embodiment, these signals are coupled to a gate driver circuit controlled by the controller 218. In an embodiment, the drains of the high-side power switches are commonly coupled to the DC+ terminal of the power supply. Thus, the drains of the high-side power switches have the same electrical potential. Similarly, the sources of the low-side power switches are commonly coupled to the DC-terminal of the power supply and have the same electrical potential. The sources of the high-side switches are respectively coupled to the drains of the corresponding low-side power switches to output power signals PU, PV, and PW. These output power signals are coupled via wires 212 to motor terminals for driving the phases of the motor.

An additional and/or alternative embodiment of the invention is described herein with reference to FIGS. 7-12.

Figure 7:
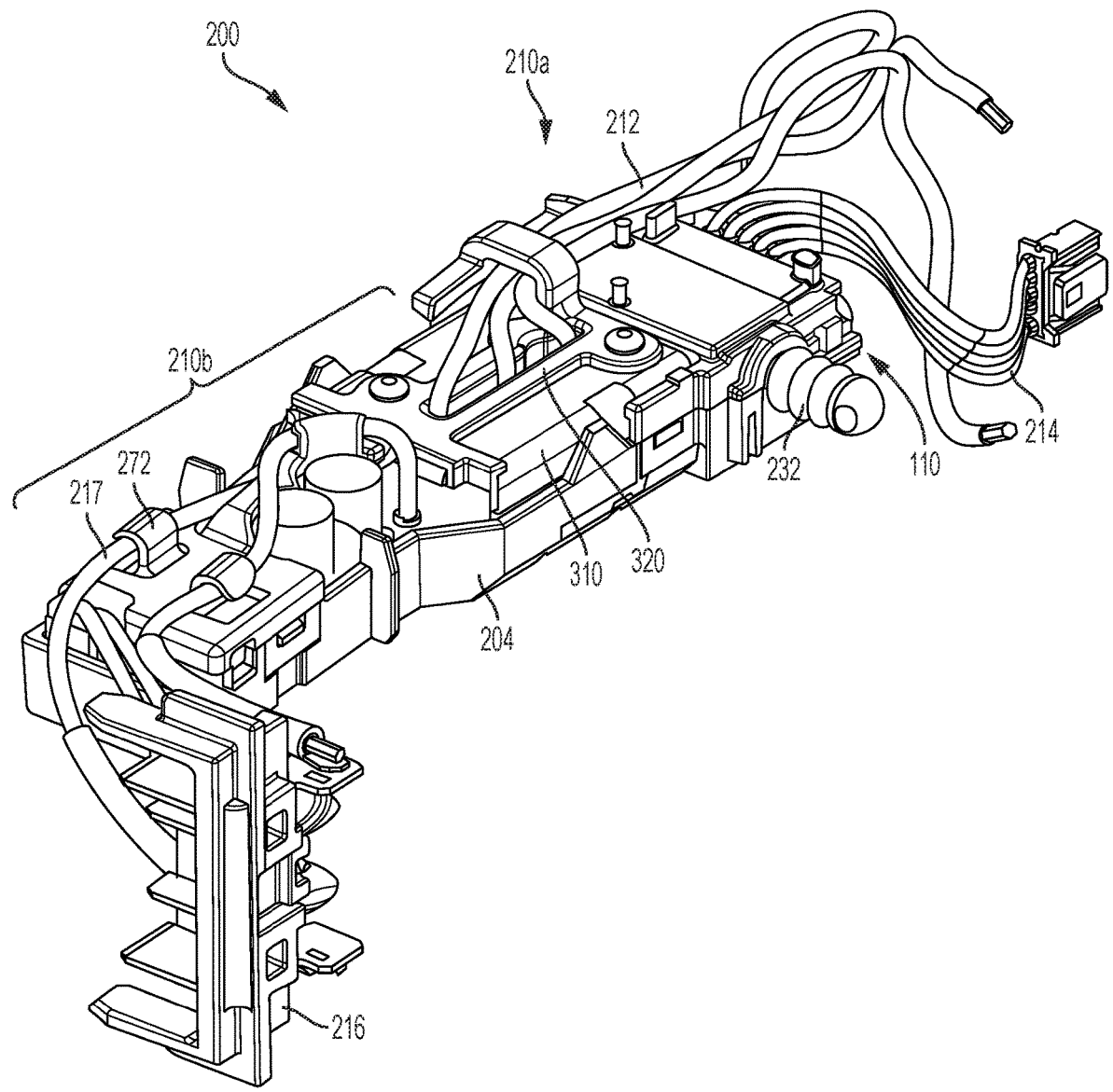
FIG. 7 depicts a perspective view of the electronic control module including a secondary heat sink, according to an additional and/or alternative embodiment.
Figure 8:
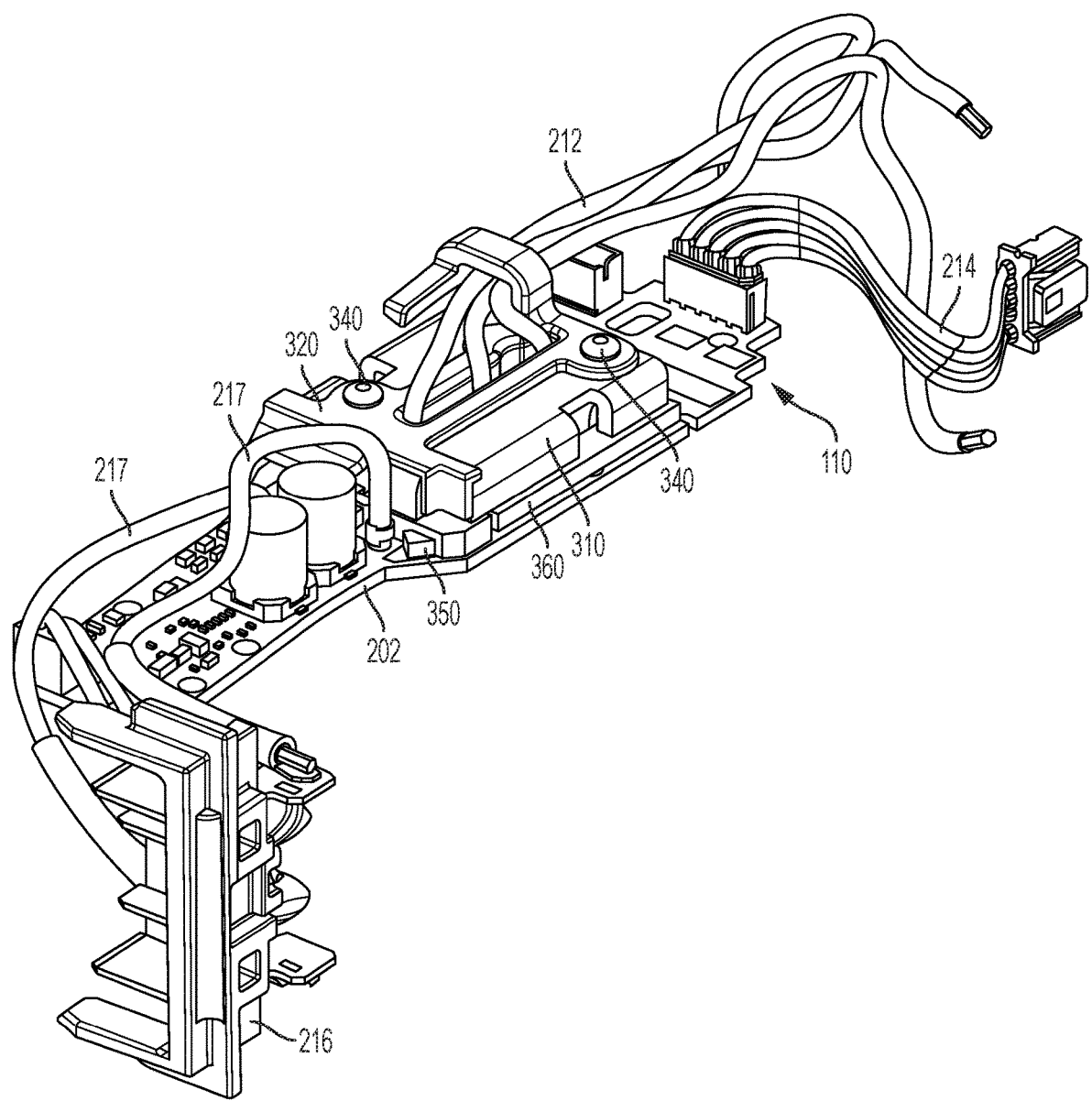
FIG. 8 depicts a perspective view of the electronic control module of FIG. 7 with module housing removed, according to an embodiment.
Figure 9:
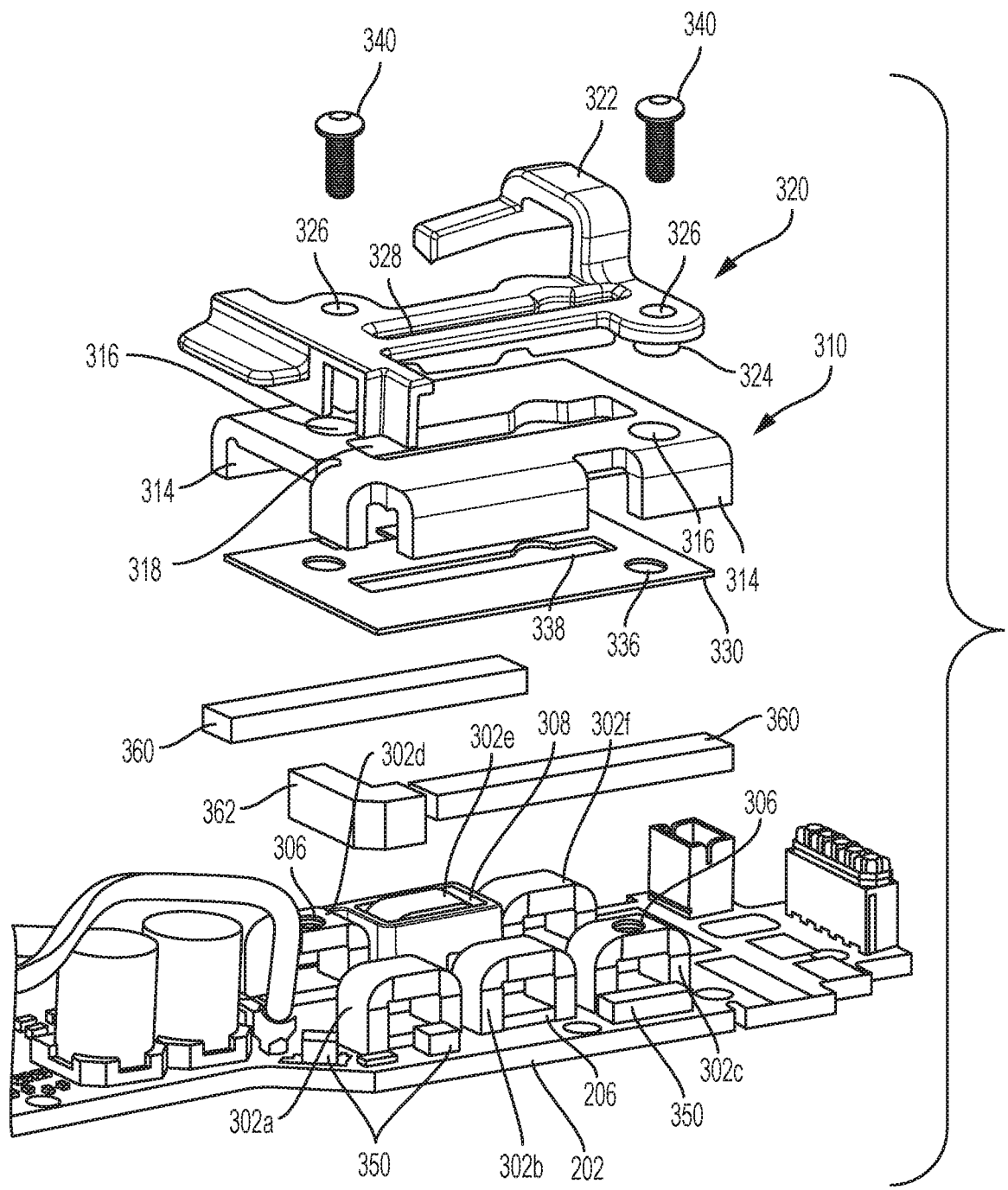
FIG. 9 depicts an exploded view of the electronic control module of FIG. 8, according to an embodiment.

FIG. 7 depicts a perspective view of the electronic control module 200, additionally provided with a secondary heat sink 310 and an insulating frame 320, for improved heat transfer from the power switches 206, according to an embodiment. FIG. 8 depicts a perspective view of the electronic control module 200 of FIG. 7, with the module housing 204 removed to show the PCB 202 and the associated components. FIG. 9 depicts an exploded perspective view of FIG. 8, according to an embodiment.

As shown in these figures, similarly to embodiment of FIGS. 2A-5, the power switches 206 of the electronic control module 200 are provided with a series of discrete heat sinks, herein referred to as primary heat sinks 302a-f, surface-mounted on the PCB 202. In this embodiment, primary heat sinks 302a-c are mounted in association with the high-side power switches and primary heat sinks 302d-f are mounted in association with the low-side power switches. As previously described, each primary heat sink 302a-f includes a main plate placed above a corresponding power switch 206, with legs that are surface mounted on the PCB 202 on both sides of the corresponding power switch 206. In an embodiment, at least one of the legs of the primary heat sinks 302a-f is electrically coupled to the drain of the corresponding power switch 206 for improved heat transfer.

It must be understood that while in this embodiment, the power switches 206 are mounted on the top surface of the PCB 202 opposite the controller 218, the power switches 206 may alternatively be mounted on the bottom surface of the PCB 202 opposite the primary heat sinks 302a-f. In such a construction, the main body of each of the primary heat sinks 302a-f may be fully mounted on the top surface of the PCB 202 opposite the corresponding power switch 206 and electrically connected to the drains of the corresponding power switch 206 through the PCB 202.

In an embodiment, depending on the power tool voltage rating and power out requirements, the primary heat sinks 302a-f may not sufficiently dissipate heat away from the power switches 202, leading to rapid temperature increases when used continuously in high load/high load condition. To overcome this problem, according to an embodiment, secondary heat sink 310 and insulating frame 320 are provided as described herein.

In an embodiment, secondary heat sink 310 includes a main body mounted directly over the top surface of the primary heat sinks 302a-f, and one or more legs 314 projecting downwardly from the min body. Secondary heat sink 310 is provided with one or more through-holes (in this example two through-holes 316 on opposite corners) that receive fastening pins 340 for attachment to one or more of the primary heat sinks (in this example one high-side switch 302c and one low-side switch 302d). In an embodiment, high-side primary heat sink 302c and low-side primary heat sink 302d are each provided with a corresponding threaded fastening receptacle 306 that receive the fastening pins 340 through the through-holes 316 of the primary heat sink 310. Threaded fastening receptacles 306 may be provided as a threaded through-holes drilled and threaded into the primary heat sinks 302c and 302d. Alternatively, fastening receptacles 306 may be provided as separate threaded inserts pressed into holes on the primary sinks 302c and 302d. With arrangement the secondary heat sink 310 is secured directly to one or more of the primary heat sinks 302a-f, rather than, for example, the module housing 204. This arrangement substantially eliminates or significantly reduces any air gap between the primary heat sinks 302a-f and the secondary heat sink 310, thus significantly improving better heat transfer between the primary heat sinks 302a-f and the secondary heat sink 310.

In an embodiment, secondary heat 310 sink further includes an elongated slot 318 arranged for passage of the power output wires 212 coming out of the PCB 202.

In an embodiment, a thermal pad 330 is disposed on the lower portion of the secondary heat sink 310 between the secondary heat sink 310 and the primary heat sinks 302a-f. Thermal pad 330 is made of a thin layer of electrically-insulating, thermally-conductive material that allow heat to transfer from the primary heat sinks 302a-f to the secondary heat sink 310, but electrically insulates the secondary heat sink 310 from all the primary heat sinks 302a-f. In an embodiment, thermal pad 330 is provided with through-holes 336 and an elongated slot 338 shaped respectively like through-holes 316 and elongated slot 318 of the secondary heat sink 310.

In an embodiment, insulating frame 320 is provided for more effective mounting and additional insulation of the secondary heat sink 320. In an embodiment, insulating frame 320 includes two through-holes 326 for receiving the fastening pins 340, and circular downwardly-projecting rims 324 arranged to be received within the through-holes 316 of the secondary heat sink 310. Rims 324 circumferentially separate and electrically insulate the fastening pins 340 from the secondary heat sink 310.

In an embodiment, fastening pins 340 are fastened (and thus electrically coupled) to primary heat sinks 302c and 302d, which are in turn electrically coupled to the drains of their corresponding power switches 206. Fastening pins 340 are therefore coupled to two different electrical potentials. The rims 324 of the insulating frame 320 electrically insulate the secondary heat sink 310 from the fastening pins 340 along the insertion axis of the fastening pins 340, thus ensuring that the secondary heat sink 320 is not electrically coupled to any of the power switches 206.

In an embodiment, insulating frame 320 is also provided with an elongated slot 328 for passage of the power output wires 212. In an embodiment, insulting frame 320 also includes downwardly-projecting walls formed around the elongated slot 328 to separate the power output wires 212 from the edges of the secondary heat sink 310 around the elongated slot 318, which may cut into and damaging to the wires 212.

In an embodiment, the insulating frame 320 further includes a wire retaining portion 322 having a substantially U-shaped profile that guides and retains the power output wires 212 coming through the elongated slot 328.

In an embodiment, one or more strips of thermal pads 360, 362 made of electrically-insulating and thermally-conductive material may be disposed between the legs 314 of the secondary heat sink 310 and the surface of the PCB 202. In an embodiment, thermal pad strips 360 and 362 may be disposed directly over the upper surface of the PCB 202, or over metal bodies 350. Metal bodies 350 are heat-carrying elements such as copper slugs positioned strategically on conductive tracks of the PCB 202 that carry high current, or near circuit components (e.g., fuses) that generate significant heat. In an embodiment, thermal pad strips 360, 362 may be made of flexible material that deform around metal bodies 350 and/or aforementioned circuit components as they are pressed down. In this manner, thermal pad strips 360, 362 cover the edges and side walls metal bodies 350 to ensure that the metal bodies 350 are fully insulated from the secondary heat sink 310, even in high debris environments where metal particles may get struck around the secondary heat sink 310. In addition, the elasticity of the thermal pad strips 360, 362 accounts for dimentional tolerances associated with the secondary heat sink 310 and other components.

As discussed above with reference to FIG. 6, the drains of the low-side power switches 206, which are electrically coupled to primary heat sinks 302d-f, are at different electrical potentials. Thus, if the electric control module 200 is contaminated with metal particles in the area of the primary heat sinks 302d-f and two of the adjacent primary heat sinks 302d-f are shorted together, it could result in catastrophic system failure. To ensure that the primary heat sinks 302d-f are insulated from one another in the event of such contamination, according to an embodiment, a rectangular-shaped insulating member 308 is disposed around the middle primary heat sink 302e on the PCB 202. The insulating member 308 has substantially the same height as the primary heat sink 302e and extends from the surface of the PCB 202 to the thermal pad 330.

Figure 10:
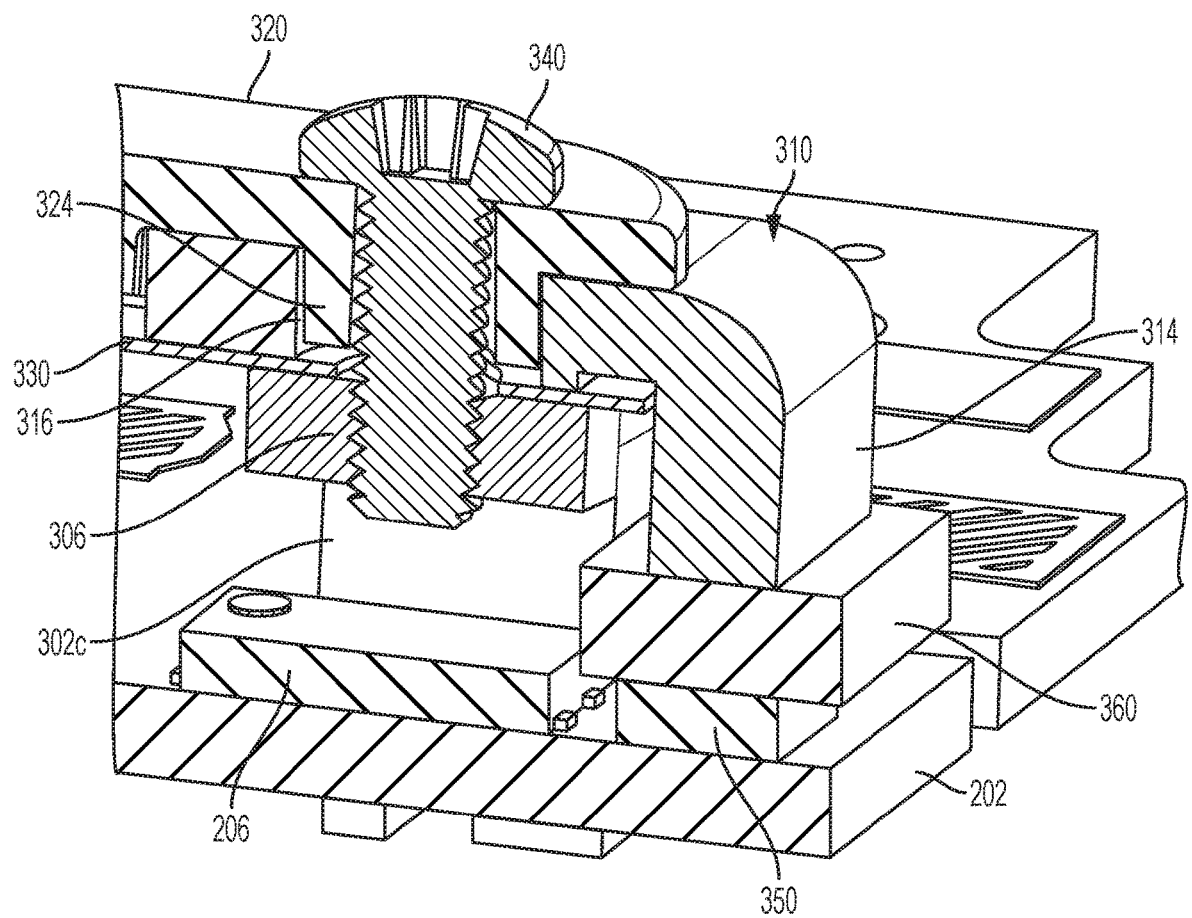
FIG. 10 depicts a partial zoomed-in cut-off view of the PCB and secondary heat sink, according to an embodiment.

FIG. 10 depicts a zoomed-in perspective cross-view of the secondary heat sink 310 mounted on the PCB 202 and secured to the primary heat sink 302c, according to an embodiment. As shown herein, the circular downwardly-projecting rims 324 of the insulating frame 320 circumferentially insulates and separates the fastening pin 340 from the secondary heat sink 310. Fastening receptacle 306 of the primary heat sink 302c is threaded and interfaces with the threaded portion of the fastening pin 340. As the fastening pin 340 is fastened, the leg 314 of the secondary heat sink presses on the thermal strip 360, which deforms around the metal body 350 until it comes in contact with, or comes substantially close to, the surface of the PCB 202.

The use of the secondary heat sink 310 as described in this embodiment allows the electronic control module 200 to be used in higher power/higher current power tool applications while effectively managing the temperature of the power switches 206. It was, for example, that the secondary heat sink 310 increases the steady-state capability of the electronic control module 200 in continuous use from under 40 amps to approximately 70 amps while keeping the temperature of the power switches 206 and other module 200 components at under 120 Celsius.

Figure 11:
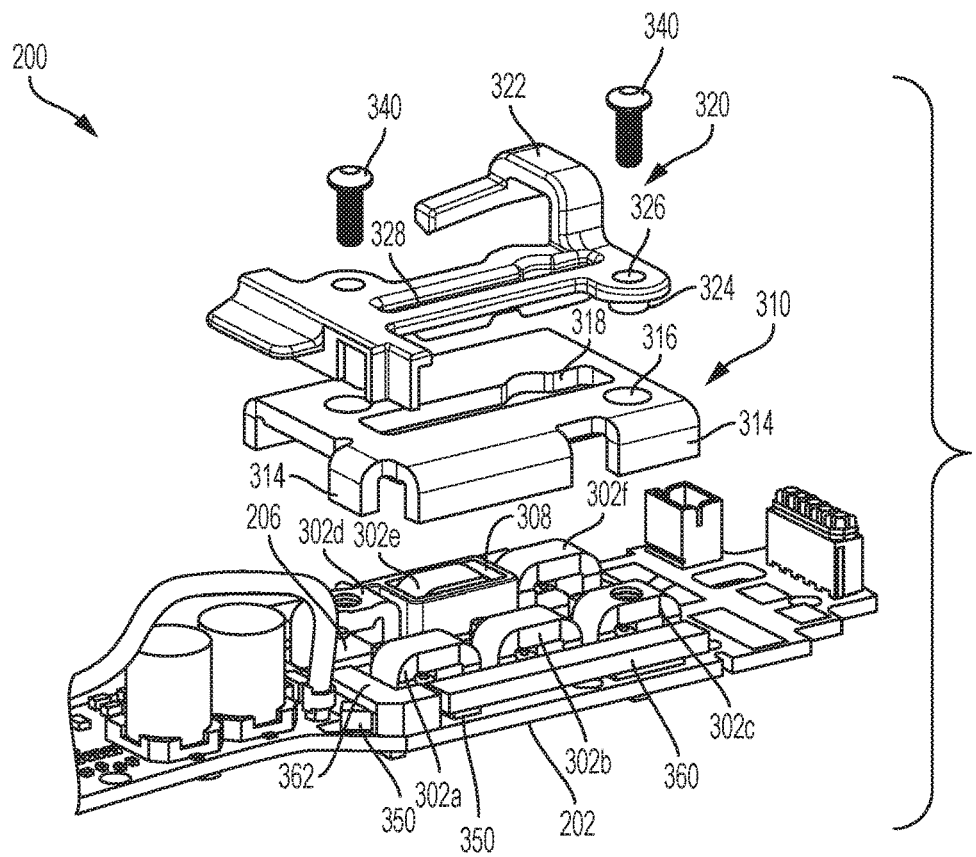
FIGS. 11 and 12 depict partial perspective views of the assembly steps of the secondary heat sink, according to an embodiment.
Figure 12:
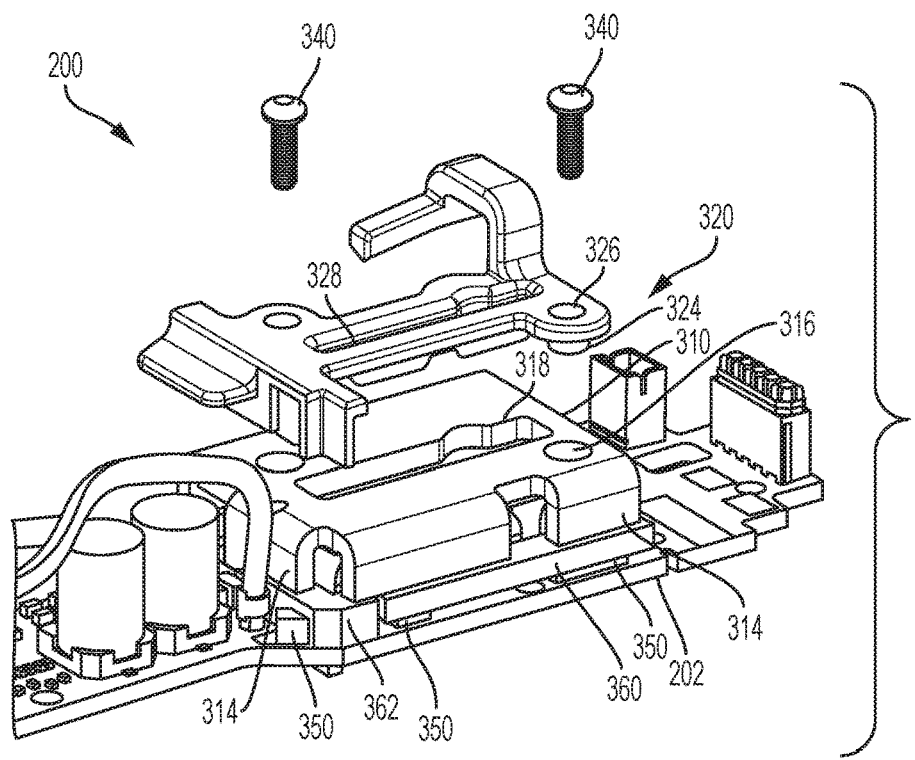

FIGS. 11 and 12 depict partial prospective views of the electronic control module 200 during the assembly process, according to an embodiment. As shown in FIG. 11, in an embodiment, thermal pad strips 360 and 362 are initially placed over the PCB 202 and/or the metal bodies 350. Thermal pad 330 (not shown) is also securely placed on a lower surface of the secondary heat sink 310. The insulating member 308 is disposed around the middle low-side primary heat sink 302e. Then, as shown in FIG. 12, the secondary heat sink 310 is mounted over the primary heat sinks 302a-f, with the legs 314 placed over the thermal pad strips 360 and 362. The insulating frame 320 is then positioned on top of the secondary heat sink 310 and the fasteners 340 located within the through-holes 326 to fasten the enter assembly to the primary heat sinks 302c and 302d.

Figure 13:
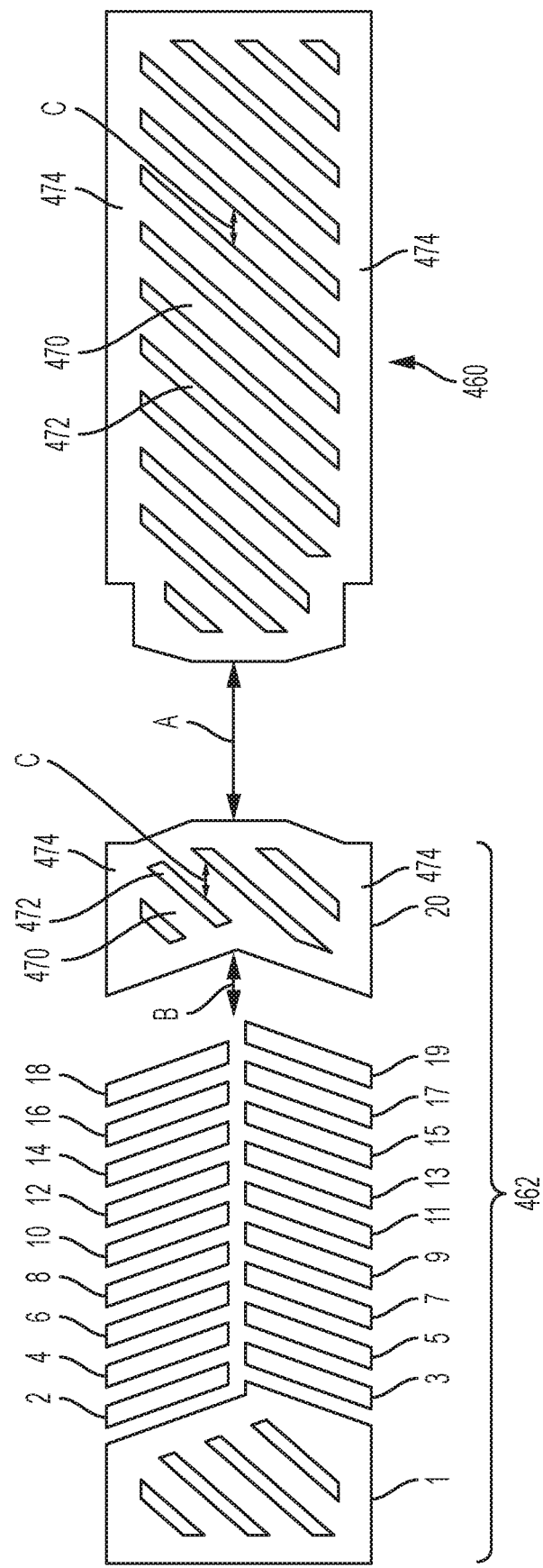
FIG. 13 depicts a top view of a sense pad and conductive pads of the electronic control module input unit, according to an embodiment.
Figure 14:
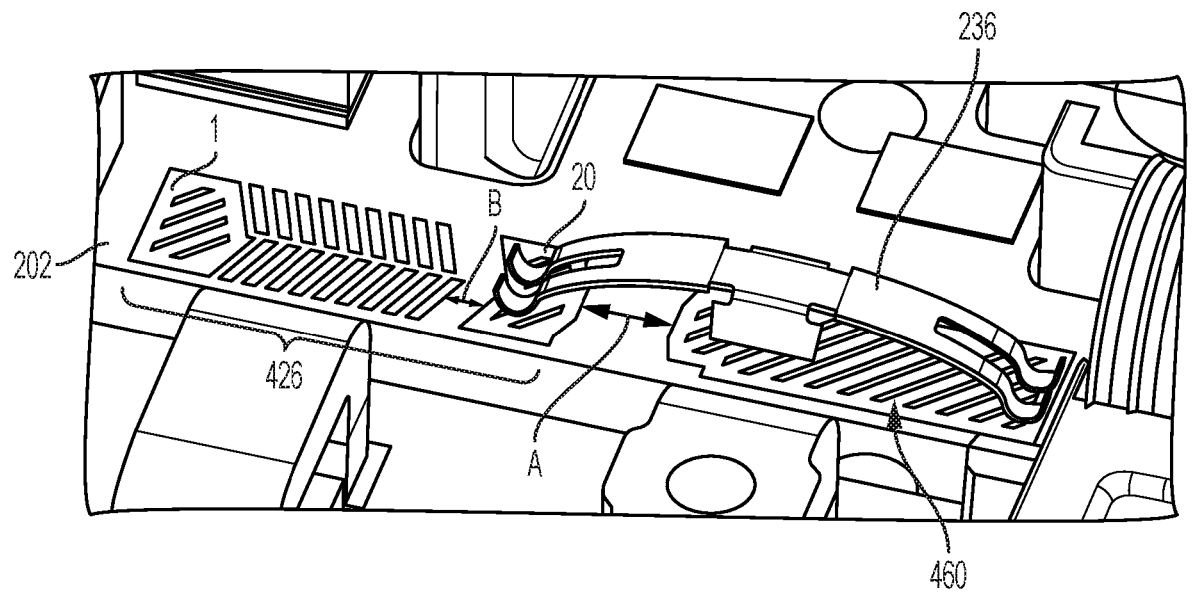
FIGS. 14 and 15 depict perspective zoomed-in views of the PCB with a wiper moving over the sense pad and the conductive pads, according to an embodiment.
Figure 15:
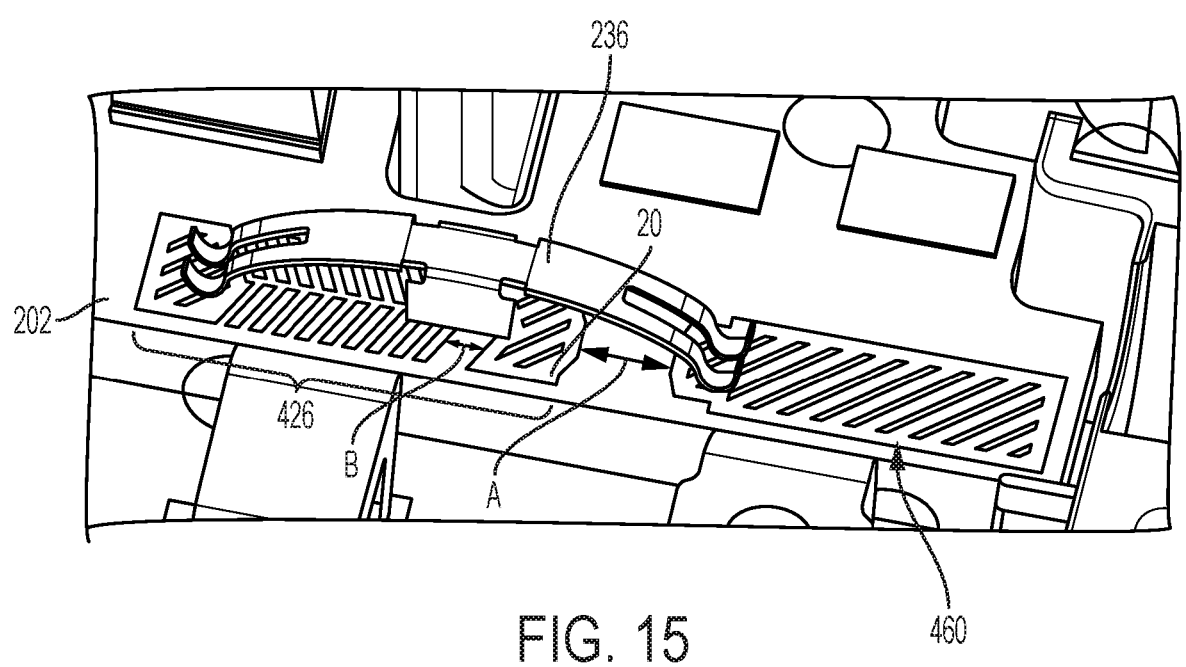

Another aspect/embodiment of the invention is described herein with reference to FIGS. 13-15.

As described above with reference to FIGS. 3A and 3B, input unit 110 of the electronic control module 200 includes variable-speed actuator 230, which includes sliding member 234 supporting conductive wiper 236. When the user presses the trigger 120, the sliding member 234 moves against a biasing force of spring 238, and conductive wiper 236 makes slidingly contact with speed-sensing member located on the surface of the PCB 202. In an embodiment, the speed-sensing member is a series of variable-speed conductive tracks 240 arranged on the PCB 202, an actuation of the trigger 120 moves the conductive wiper 236 over the conductive tracks 240. Initial movement of the conductive wiper 236 over the conductive tracks 240 generates a signal that turns controller 218 ON. Additionally, an analog variable-voltage signal is generated based on the movement of the conductive wiper 128 over the conductive tracks and that signal is sent to the micro-controller.

U.S. Pat. No. 9,508,498 filed May 21, 2012, which is incorporated herein by reference in its entirety, described the arrangement and circuit connectivity of the variable speed conductive tracks 240 in detail (see FIGS. 10A-13C). As described in this disclosure, the conductive tracks 240 include a sense pad 160 and a series of conductive tracks 162 arranged in line with the sense pad 160. At its initial default position, the wiper 128 makes contact with pad 162(20), which is coupled to the B+ terminal of the power supply. As the trigger is pressed, the wiper moves from pad 162(20) to pad 162(19), causing a large voltage drop to be sensed on sense pad 160, which generates a signal to begin supplying power to the controller. From there, as the trigger is pressed further, the wiper moves from pad 162(19) all the way to pad 162(1) at its fully-pressed position, resulting in stepped voltage drop on the sense pad 160. The controller monitors the voltage on the sense pad 160 and controls the speed of the motor according to the voltage level on the sense pad 160.

The tips of the wiper (See e.g., tips a-d of the wiper 128 in FIG. 10A of the '498 patent) are often chamfered for smooth movement of the wiper over the conductive pads. However, due to manufacturing process or equipment failure, the wiper tips of some wipers may inadvertently include sharp edges capable of cutting into the conductive tracks and scraping off strips of metal that then get stuck between adjacent conductive pads. This is particularly problematic if the sharp edges of the wiper cut into the sense pad or the two end pads, where the travel distance of the wiper edge may be up to 10 mm. These metal strips may get struck between the conductive tracks and cause serious system failure—e.g. between sense pad 160 and end pad 162(20) in the '498 patent, in which case the tool will not turn on with trigger pull, or between the end pad 162(20) and resistive pad 162(19), in which case the tool will turn on inadvertently.

In order to overcome this problem, according to an embodiment of the invention, a segmented pad design is provided, as shown in FIGS. 13-15. FIG. 13 depicts a top view of the sense pad 460 and conductive pads 462. FIGS. 14 and 15 depict perspective zoomed-in views of the PCB 202 with the wiper 236 moving over the sense pad 460 and the conductive pads 462.

As shown in these figures, sense pad 460 is partitioned into a series of segments 470 disposed on the PCB 202 with parallel linear gaps 472 therebetween. In other words, sense pad 460 is printed on the PCB 202 with linear gaps 472 so as to expose the PCB 202 between segments 470. The end pads 462(1) and 462(20) of the conductive pads 462 may similarly be segmented into a series of segments 470 with linear gaps 472 therebetween.

In an embodiment, the linear gaps 472 may be oriented diagonally with respect to an axis of movement of the wiper 236. Alternatively, linear gaps 427 may be disposed substantially perpendicularly with respect to the axis.

In an embodiment, linear gaps 427 extend from axial boundary portions 474 so as to intersect the travel path of the wiper 236 tips. As such, the boundary portions 474 electrically connect the segments 470 together.

In an embodiment, linear gaps 427 are positioned such that a width 'C' of each segment 470 along the axis of movement of the wiper 236 is smaller than distance 'A' between the sense pad 460 and the end pad 462(20). In an embodiment, distance 'C' is also smaller than distance 'B' between end pad 462(20) and the nearest conductive pad 462(19). This configuration ensures that as the wiper 236 moves along the sense pad 460 and/or the conductive pads 462, it cannot scrape off a strip of metal debris longer than the distances 'A' or 'B'. In other words, even if a piece of the sense pad 460 or the conductive pads 462 is scraped off by the wiper 236 edges, the length of the piece cannot be large enough to electrically short the sense pad 460 to the end pad 462(20), or the end pad 462(20) to the conductive pad 462(19).

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The invention claimed is:

1. An electronic switch module for driving an electric motor, comprising:
   a printed circuit board (PCB);
   a plurality of power switches mounted on the PCB and configured to switchably supply electric power from a power source to the electric motor;
   a plurality of power output wires attached to the PCB to facilitate electrical connection between the plurality of power switches and the electric motor;
   a plurality of primary heat sinks mounted on the PCB in association with the plurality of power switches; and
   a secondary heat sink including a planar body mounted on the plurality of primary heat sinks, the planar body including a slot therein through which the plurality of power output wires passes.

2. The electronic switch module of claim 1, further comprising a module housing within which the PCB is disposed.

3. The electronic switch module of claim 1, further comprising a thermal pad disposed between an upper portion of the plurality of primary heat sinks and the planar body of the secondary heat sink to electrically insulate the secondary heat sink from the plurality of primary heat sinks, the thermal pad comprising thermally conductive material.

4. The electronic switch module of claim 1, further comprising an insulating frame mounted over the secondary heat sink, the insulating frame comprising a frame slot corresponding to the slot of the secondary heat sink, and a wire retaining portion arranged to guide the plurality of power output wires passing through the frame slot.

5. The electronic switch module of claim 1, further comprising wherein the plurality of primary heat sinks are arranged along two parallel rows and the slot is elongated in line with an area between the two parallel rows.

6. The electronic switch module of claim 1, wherein the secondary heat sink comprises at least one leg projecting downwardly from the planar body, and the electronic switch module comprises at least one thermal pad strip comprising deformable thermally-conductive and electrically-insulating material disposed between the leg of the secondary heat sink and the PCB.

7. The electronics switch module of claim 6, further comprising at least one metal body disposed over the PCB for heat transfer from at least one of a circuit component mounted on the PCB or conductive track on the PCB, wherein the at least one thermal pad strip is disposed between the at least one metal body and the leg of the secondary heat sink.

8. The electronic switch module of claim 1, further comprising a controller disposed on the PCB, and an input unit coupled to a trigger switch, wherein the controller is configured to control a switching operation of the plurality of power switches based on an input from the input unit.

9. The electronic switch module of claim 1, wherein the plurality of power switches is mounted on a same surface of the PCB as the plurality of primary heat sinks, each of the plurality of primary heat sinks comprising two legs secured to the PCB on two sides of a respective one of the plurality of power switches.

10. The electronic switch module of claim 1, wherein the secondary heat sink is fastened to at least one of the plurality of primary heat sinks via a fastener.

11. A power tool comprising:
a housing;
a motor disposed in the housing; and
an electronic switch module coupled to the motor to control a supply of power to the motor, the electronic switch module comprising:
a printed circuit board (PCB);
a plurality of power switches mounted on the PCB and configured to switchably supply electric power from a power source to the electric motor;
a plurality of power output wires attached to the PCB to facilitate electrical connection between the plurality of power switches and the electric motor;
a plurality of primary heat sinks mounted on the PCB in association with the plurality of power switches; and
a secondary heat sink including a planar body mounted on the plurality of primary heat sinks, the planar body including a slot therein through which the plurality of power output wires passes.

12. The power tool of claim 11, further comprising a module housing within which the PCB is disposed.

13. The power tool of claim 11, further comprising a thermal pad disposed between an upper portion of the plurality of primary heat sinks and the planar body of the secondary heat sink to electrically insulate the secondary heat sink from the plurality of primary heat sinks, the thermal pad comprising thermally conductive material.

14. The power tool of claim 11, further comprising an insulating frame mounted over the secondary heat sink, the insulating frame comprising a frame slot corresponding to the slot of the secondary heat sink, and a wire retaining portion arranged to guide the plurality of power output wires passing through the frame slot.

15. The power tool of claim 11, further comprising wherein the plurality of primary heat sinks are arranged along two parallel rows and the slot is elongated in line with an area between the two parallel rows.

16. The power tool of claim 11, wherein the secondary heat sink comprises at least one leg projecting downwardly from the planar body, and the electronic switch module comprises at least one thermal pad strip comprising deformable thermally-conductive and electrically-insulating material disposed between the leg of the secondary heat sink and the PCB.

17. The power tool of claim 16, further comprising at least one metal body disposed over the PCB for heat transfer from at least one of a circuit component mounted on the PCB or conductive track on the PCB, wherein the at least one thermal pad strip is disposed between the at least one metal body and the leg of the secondary heat sink.

18. The power tool of claim 11, further comprising a controller disposed on the PCB, and an input unit coupled to a trigger switch, wherein the controller is configured to control a switching operation of the plurality of power switches based on an input from the input unit.

19. The power tool of claim 11, wherein the plurality of power switches is mounted on a same surface of the PCB as the plurality of primary heat sinks, each of the plurality of primary heat sinks comprising two legs secured to the PCB on two sides of a respective one of the plurality of power switches.

20. The power tool of claim 11, wherein the secondary heat sink is fastened to at least one of the plurality of primary heat sinks via a fastener.

* * * * *